US012640690B2

(12) United States Patent
Abouzied

(10) Patent No.: US 12,640,690 B2
(45) Date of Patent: May 26, 2026

(54) RADIO-FREQUENCY AMPLIFIER WITH LARGE SIGNAL PROTECTION

(71) Applicant: Apple Inc., Cupertino, CA (US)

(72) Inventor: Mohamed Abouzied, La Jolla, CA (US)

(73) Assignee: Apple Inc., Cupertino, CA (US)

( * ) Notice: Subject to any disclaimer, the term of this patent is extended or adjusted under 35 U.S.C. 154(b) by 601 days.

(21) Appl. No.: 18/182,275

(22) Filed: Mar. 10, 2023

(65) Prior Publication Data

US 2024/0305250 A1    Sep. 12, 2024

(51) Int. Cl.
*H03G 3/30* (2006.01)
*H03F 1/52* (2006.01)
*H03F 3/21* (2006.01)

(52) U.S. Cl.
CPC ............... *H03F 1/523* (2013.01); *H03F 3/21* (2013.01); *H03F 2200/451* (2013.01)

(58) Field of Classification Search
CPC ........................................................ H03G 3/30
USPC .................................................. 330/279, 278
See application file for complete search history.

(56) References Cited

U.S. PATENT DOCUMENTS

| | | | |
|---|---|---|---|
| 4,663,580 A | 5/1987 | Wortman | |
| 6,972,626 B2 * | 12/2005 | Takahashi | ............ H03G 3/3047 |
| | | | 330/285 |
| 7,864,498 B1 | 1/2011 | Loeb et al. | |
| 7,962,109 B1 | 6/2011 | Stockstad et al. | |
| 8,274,333 B2 | 9/2012 | Dupuis | |
| 10,447,215 B2 * | 10/2019 | Chen | ...................... H03F 3/191 |
| 2011/0095817 A1 | 4/2011 | Yamada | |
| 2022/0045499 A1 | 2/2022 | Lee et al. | |

* cited by examiner

*Primary Examiner* — Henry Choe
(74) *Attorney, Agent, or Firm* — Treyz Law Group; Jason Tsai

(57) ABSTRACT

Wireless circuitry can include a radio-frequency amplifier, a power detection circuit coupled to an output of the radio-frequency amplifier and configured to output a power detection voltage, protection circuitry coupled to the power detection circuit and configured to output a protection voltage, and a control circuit configured to adjust the amplifier based on the power detection voltage and the protection voltage. The protection circuitry can include a current mirroring circuit that outputs a current proportional to a supply current of the power detection circuit and an adjustable current-to-voltage converter such as an adjustable resistor that receives the current to generate the protection voltage. The control circuit can adjust the radio-frequency amplifier by tuning a supply voltage or a bias voltage of the radio-frequency amplifier to reduce the gain of the radio-frequency amplifier, thereby proactively preventing the amplifier from outputting signals with large swings that can potentially damage the wireless circuitry.

18 Claims, 8 Drawing Sheets

RADIO-FREQUENCY AMPLIFIER WITH LARGE SIGNAL PROTECTION

FIELD

This disclosure relates generally to electronic devices and, more particularly, to electronic devices with wireless communications circuitry.

BACKGROUND

Electronic devices can be provided with wireless communications capabilities. An electronic device with wireless communications capabilities has wireless communications circuitry with one or more antennas. Wireless transceiver circuitry in the wireless communications circuitry uses the antennas to transmit and receive radio-frequency signals.

Radio-frequency signals transmitted by an antenna can be fed through a power amplifier, which is configured to amplify low power analog signals to higher power signals more suitable for transmission through the air over long distances. Radio-frequency signals received at an antenna can be fed through a low noise amplifier, which is configured to amplify low power analog signals to higher power signals for ease of processing at a receiver. It can be challenging to design a satisfactory radio-frequency amplifier for an electronic device.

SUMMARY

An electronic device may include wireless communications circuitry. The wireless communications circuitry may include one or more processors or signal processing blocks for generating baseband signals, a transceiver for upconverting (modulating) the baseband signals to radio frequencies and for downconverting (demodulating) radio-frequency signals to baseband signals, a radio-frequency power amplifier for amplifying radio-frequency signals prior to transmission at one or more antennas, and a radio-frequency low noise amplifier for amplifying radio-frequency signals received at one or more antennas in the electronic device.

An aspect of the disclosure provides wireless circuitry that includes a radio-frequency amplifier, a power detection circuit coupled to an output of the radio-frequency amplifier, a current mirror circuit configured to output a current that is proportional to a supply current of the power detection circuit, a current-to-voltage converter configured to receive the current from the current mirror circuit and to generate a corresponding protection voltage, and a control circuit configured to adjust the radio-frequency amplifier based on the protection voltage. The current-to-voltage converter can be an adjustable resistor. The current mirror circuit can include a transistor having a gate terminal coupled to the power detection circuit, a first source-drain terminal coupled to a power supply line, and a second source-drain terminal coupled to the resistor.

The power detection circuit can include an alternating current (AC) to direct current (DC) conversion subcircuit, a first load transistor coupled between a positive power supply line and the AC to DC conversion subcircuit, and a second load transistor coupled between the positive power supply line and the AC to DC conversion subcircuit, where the current mirror circuit can be coupled to gate terminals of the first and second load transistors. The power detection circuit can be configured to output a power detection voltage, and the control circuit can further be configured to adjust the radio-frequency amplifier based on the power detection voltage. The power detection voltage output from the power detection circuit can saturate when a signal level at the output of the radio-frequency amplifier exceeds a threshold level, whereas the protection voltage does not saturate when a signal level at the output of the radio-frequency amplifier exceeds the threshold level. The power detection voltage can vary within a first range of signal levels at the output of the radio-frequency amplifier, whereas the protection voltage can vary within a second range of signal levels, greater than the first range of signal levels, at the output of the radio-frequency amplifier. The control circuit can be configured to adjust the radio-frequency amplifier by adjusting a supply or bias voltage of the radio-frequency amplifier to reduce a gain of the radio-frequency amplifier.

An aspect of the disclosure provides a method that includes using a radio-frequency (RF) amplifier to amplify radio-frequency signals, using a power detector coupled to an output of the RF amplifier to generate a power detection voltage, using a current mirror to output a current that is proportional to a supply current of the power detector, using a current-to-voltage converter to receive the current and to generate a corresponding protection voltage, and using a controller to adjust the RF amplifier based on the power detection voltage and the protection voltage. The current-to-voltage converter can be a resistor, and the method can further include adjusting a resistance value of the resistor. The method can further include using the power detection voltage to adjust a gain of the radio-frequency amplifier in accordance with an automatic power control algorithm or an automatic gain control algorithm, using the power detection voltage to adjust a gain of the radio-frequency amplifier in accordance with an automatic power control algorithm or an automatic gain control algorithm when signal levels at the output of the radio-frequency amplifier are within a first range, and using the protection voltage to reduce the gain of the radio-frequency amplifier when signal levels at the output of the radio-frequency amplifier are within a second range different than the first range. The power detection voltage can clip when signal levels at the output of the radio-frequency amplifier are within the second range, whereas the protection voltage does not clip when signal levels at the output of the radio-frequency amplifier are within the second range.

An aspect of the disclosure provides circuitry that includes an amplifier, a power detection circuit coupled to an output of the amplifier, overvoltage protection circuitry coupled to the power detection circuit and configured to output a protection voltage, and a control circuit configured to adjust the amplifier based on the protection voltage. The power detection circuit can include a signal squaring subcircuit, a first load transistor coupled to the signal squaring subcircuit, and a second load transistor coupled to the signal squaring subcircuit, where the first and second load transistors have gate terminals coupled to the overvoltage protection circuitry. The overvoltage protection circuitry can include a transistor having a gate terminal coupled to the power detection circuit and configured to output a current that is proportional to a supply current of the power detection circuit and a current-to-voltage converter coupled in series with the transistor and configured to generate the protection voltage. The power detection circuit can be configured to generate a power detection voltage, and the control circuit can further be configured to adjust the amplifier based on the power detection voltage.

DETAILED DESCRIPTION

Figure 1:
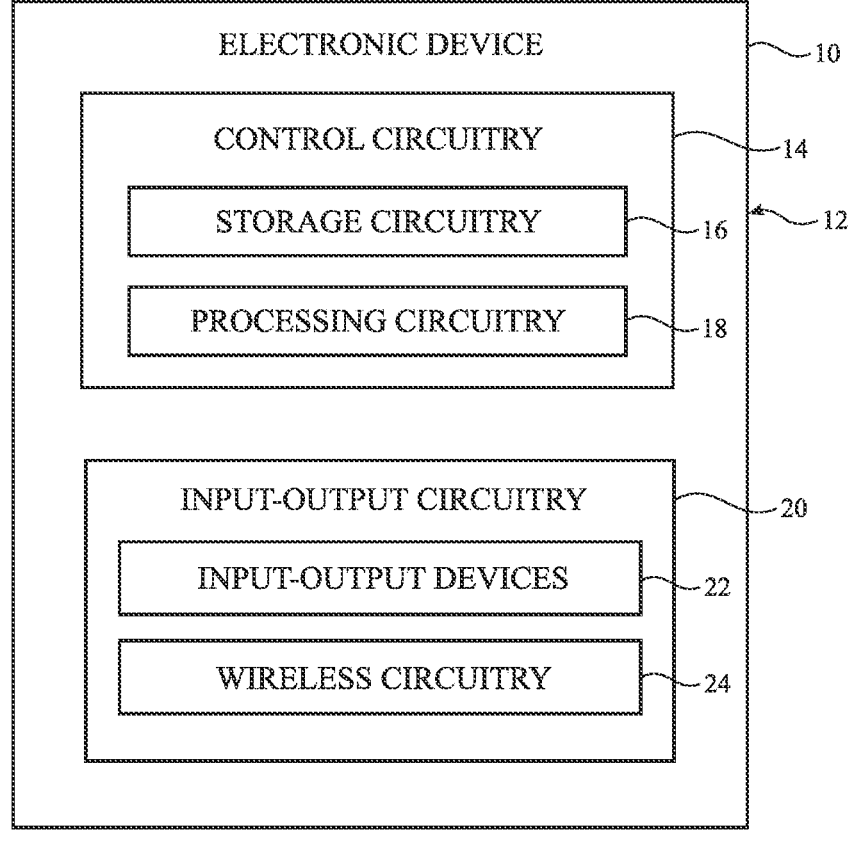
FIG. 1 is a diagram of an illustrative electronic device having wireless circuitry in accordance with some embodiments.

An electronic device such as device 10 of FIG. 1 may be provided with wireless circuitry. Wireless circuitry can include radio-frequency amplifiers such as power amplifiers and low noise amplifiers. Power amplifiers can be used to amplify radio-frequency signals in a transmit path, whereas low noise amplifiers can be used to amplify radio-frequency signals in a receive path. Power detection circuits can be coupled at the outputs of these radio-frequency amplifiers. A power detector coupled at the output of a radio-frequency power amplifier can be configured to run an adaptive power control algorithm for adjusting a power level of the power amplifier, whereas a power detector coupled at the output of a radio-frequency low noise amplifier can be used to run an automatic gain control algorithm for adjusting a power level of the low noise amplifier.

A power detector may output a power detection voltage that clips or saturates when the signal strength at the output of the associated radio-frequency amplifier exceeds a threshold level. The radio-frequency amplifier can further include protection circuitry configured to provide additional control of the radio-frequency amplifier when the signal strength at the output of the amplifier is greater than the threshold level. The protection circuitry can tap into an internal node of the power detector to generate a replica supply current. The replica supply current can be pass through an adjustable resistance to generate a protection voltage. A feedback controller can selectively adjust the radio-frequency amplifier based on the power detection voltage and the protection voltage. Configured and operated in this way, the protection circuitry can prevent the radio-frequency amplifier from damage that can be caused by large signals arriving at the radio-frequency amplifier and can help extend the lifetime of the wireless circuitry.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Figure 2:
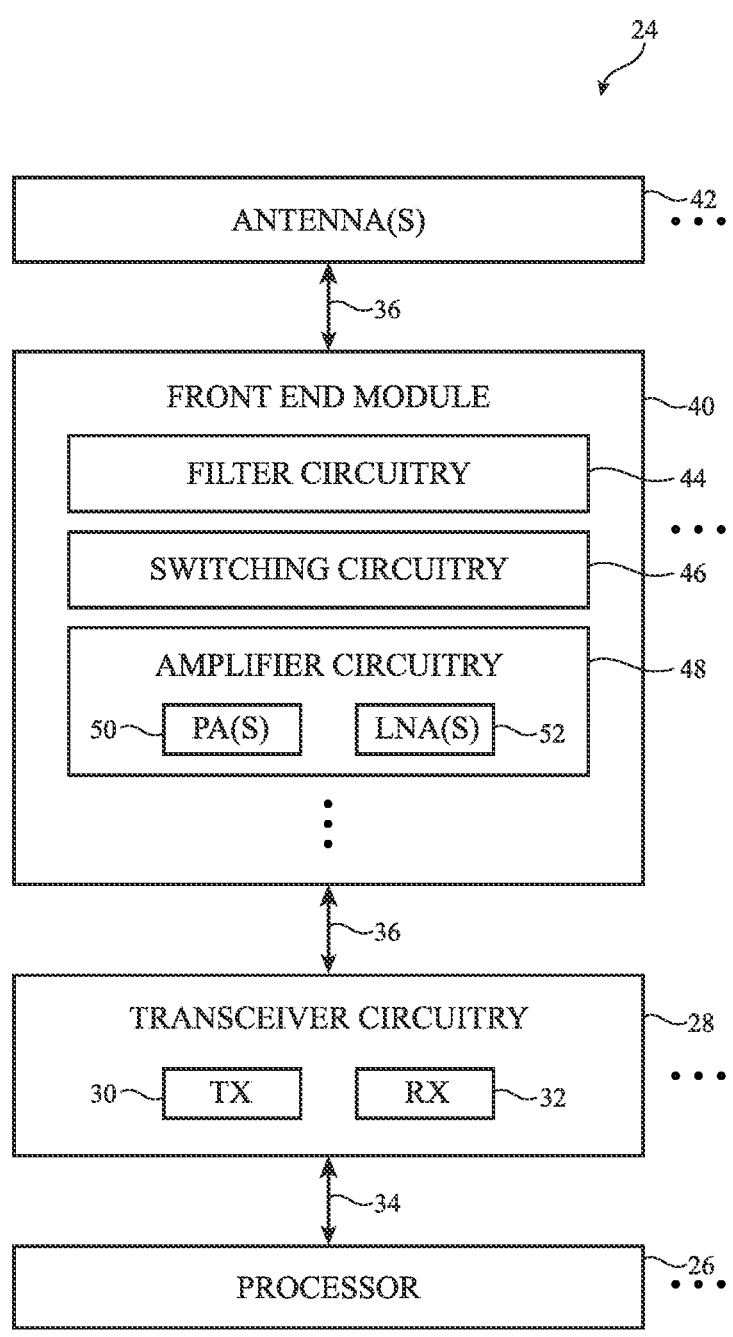
FIG. 2 is a diagram of illustrative wireless circuitry having radio-frequency amplifiers in accordance with some embodiments.

FIG. 2 is a diagram showing illustrative components within wireless circuitry 24. As shown in FIG. 2, wireless circuitry 24 may include a processor such as processor 26, radio-frequency (RF) transceiver circuitry such as radio-frequency transceiver 28, radio-frequency front end circuitry such as radio-frequency front end module (FEM) 40, and antenna(s) 42. Processor 26 may be a baseband processor, application processor, general purpose processor, microprocessor, microcontroller, digital signal processor, host processor, application specific signal processing hardware, or other type of processor. Processor 26 may be coupled to transceiver 28 over path 34. Transceiver 28 may be coupled to antenna 42 via radio-frequency transmission line path 36. Radio-frequency front end module 40 may be disposed on radio-frequency transmission line path 36 between transceiver 28 and antenna 42.

In the example of FIG. 2, wireless circuitry 24 is illustrated as including only a single processor 26, a single transceiver 28, a single front end module 40, and a single antenna 42 for the sake of clarity. In general, wireless circuitry 24 may include any desired number of processors 26, any desired number of transceivers 28, any desired number of front end modules 40, and any desired number of antennas 42. Each processor 26 may be coupled to one or more transceiver 28 over respective paths 34. Each transceiver 28 may include a transmitter circuit 30 configured to output uplink signals to antenna 42, may include a receiver circuit 32 configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module disposed thereon.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is merely illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards.

In performing wireless transmission, processor 26 may provide transmit signals (e.g., digital or baseband signals) to transceiver 28 over path 34. Transceiver 28 may further include circuitry for converting the transmit (baseband) signals received from processor 26 configured to generate a current that at least partially cancels a non-linear current associated with the input transistor into corresponding radio-frequency signals. For example, transceiver circuitry 28 may include mixer circuitry for up-converting (or modulating) the transmit (baseband) signals to radio frequencies prior to transmission over antenna 42. The example of FIG. 2 in which processor 26 communicates with transceiver 28 is merely illustrative. In general, transceiver 28 may communicate with a baseband processor, an application processor, general purpose processor, a microcontroller, a microprocessor, or one or more processors within circuitry 18. Transceiver circuitry 28 may also include digital-to-analog converter (DAC) and/or analog-to-digital converter (ADC) circuitry for converting signals between digital and analog domains. Transceiver 28 may use transmitter (TX) 30 to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from the external wireless equipment. The received radio-frequency signals may be conveyed to transceiver 28 via radio-frequency transmission line path 36 and front end module 40. Transceiver 28 may include circuitry such as receiver (RX) 32 for receiving signals from front end module 40 and for converting the received radio-frequency signals into corresponding baseband signals. For example, transceiver 28 may include mixer circuitry for down-converting (or demodulating) the received radio-frequency signals to baseband frequencies prior to conveying the received signals to processor 26 over path 34.

Front end module (FEM) 40 may include radio-frequency front end circuitry that operates on the radio-frequency signals conveyed (transmitted and/or received) over radio-frequency transmission line path 36. FEM 40 may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifier circuits 50 and/or one or more low-noise amplifier circuits 52), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip. If desired, amplifier circuitry 48 and/or other components in front end 40 such as filter circuitry 44 may also be implemented as part of transceiver circuitry 28.

Filter circuitry 44, switching circuitry 46, amplifier circuitry 48, and other circuitry may be disposed along radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Transceiver 28 may be separate from front end module 40. For example, transceiver 28 may be formed on another substrate such as the main logic board of device 10, a rigid printed circuit board, or flexible printed circuit that is not a part of front end module 40. While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, processor 26 and/or portions of transceiver 28 (e.g., a host processor on transceiver 28) may form a part of control circuitry 14. Control circuitry 14 (e.g., portions of control circuitry 14 formed on processor 26, portions of control circuitry 14 formed on transceiver 28, and/or portions of control circuitry 14 that are separate from wireless circuitry 24) may provide control signals (e.g., over one or more control paths in device 10) that control the operation of front end module 40.

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

Figure 3:
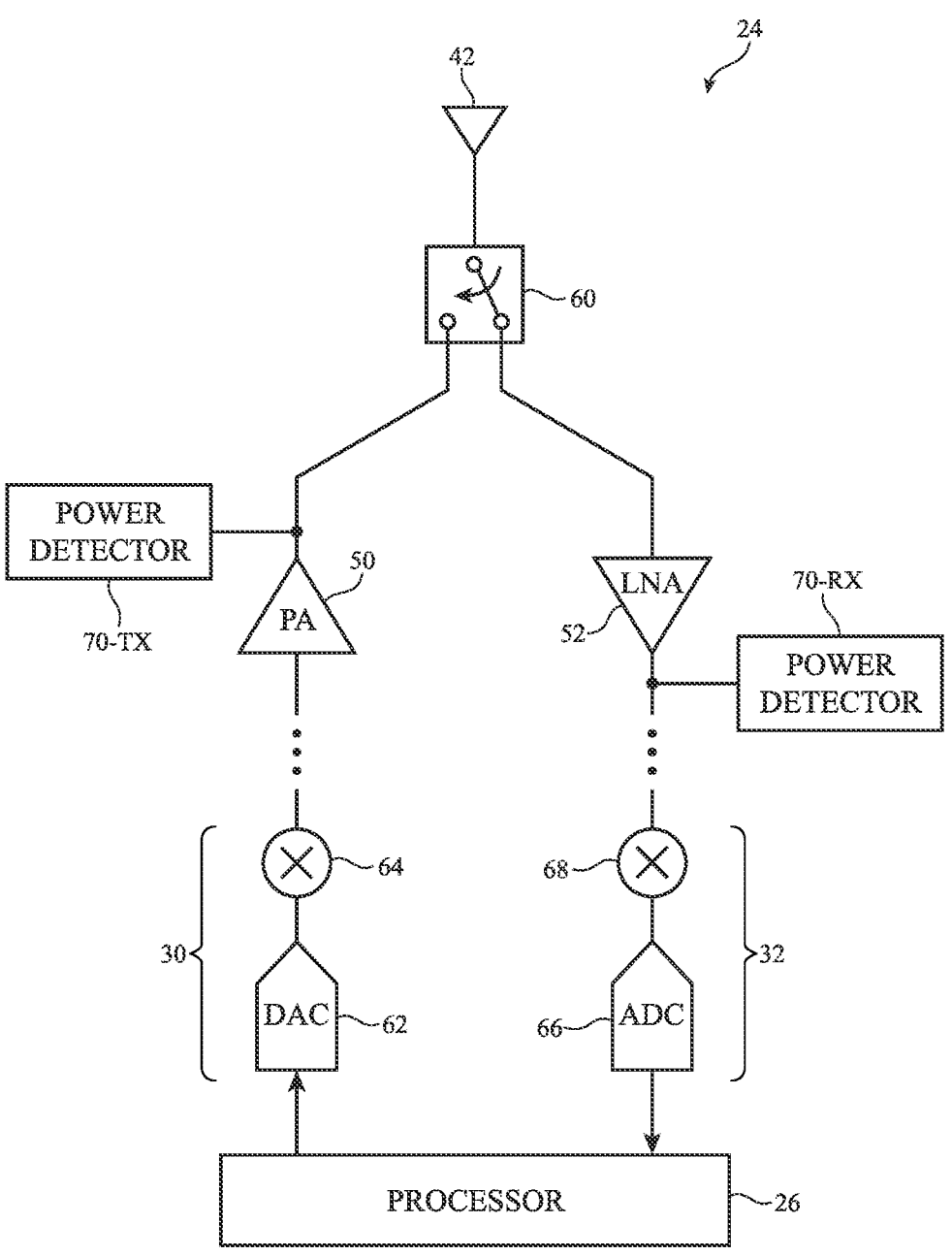
FIG. 3 is a diagram showing illustrative power detectors coupled to radio-frequency amplifier outputs in accordance with some embodiments.

Radio-frequency amplifiers may be coupled to power detectors for power monitoring purposes. FIG. 3 is a diagram showing illustrative power detectors coupled to radio-frequency amplifier outputs. As shown in FIG. 3, wireless circuitry 24 can have one or more antenna 42 that is coupled to a transmit path and a receive path via a radio-frequency duplexing circuit such as duplexer 60. Duplexer 60 may have a first port coupled to a shared antenna 42, a second port coupled to the transmit path (e.g., a second port configured to receive amplified radio-frequency signals to be radiated by antenna 42), and a third port coupled to the receive path (e.g., a third port to which radio-frequency signals received by antenna 42 are conveyed).

The receive path can include low noise amplifier (LNA) circuitry 52, a downconverting mixing circuit such as mixer 68, and a data converter such as analog-to-digital converter (ADC) 66. The LNA circuitry 52 can include one or more amplifiers coupled in series and/or in parallel. Mixer 68 may use a local oscillator signal to downconvert (or demodulate) the radio-frequency signals to baseband (or intermediate) frequencies. Analog-to-digital converter (ADC) circuit 66 can then convert the demodulated signals from the analog domain to the digital domain to generate corresponding digital baseband signals. Mixer 68 and ADC circuit 66 are sometimes be considered part of receiver circuitry 32. The digital baseband signals can then be received by one or more processors 26. Processor 26 may represent one or more processors such as a baseband processor, an application processor, a digital signal processor, a microcontroller, a microprocessor, a central processing unit (CPU), a programmable device, a combination of these circuits, and/or one or more processors within circuitry 18 (see FIG. 1).

The circuitry described above for processing signals received by antenna 42 is sometimes referred to collectively as wireless receiving circuitry. If desired, one or more additional front end module components such as radio-frequency filter circuitry 44 of FIG. 2 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), impedance matching circuitry, antenna tuning circuitry (e.g., networks of capacitors, resistors, inductors, and/or switches that adjust the frequency response of antenna 42), radio-frequency coupler circuitry, charge pump circuitry, power management circuitry, and/or any other desired front-end module circuitry can optionally be coupled at the input and/or output of LNA circuitry 52 along the radio-frequency reception line path.

On the other hand, the transmit path can include power amplifier (PA) circuitry 50, a upconverting mixing circuit such as mixer 64, and a data converter such as digital-to-analog converter (DAC) 62. Processor 26 can generate digital baseband signals, sometimes referred to as digital signals for transmission. DAC circuit 62 can convert the digital baseband signals from the digital domain to the analog domain to generate corresponding analog baseband signals. Mixer 64 may use a local oscillator signal to upconvert (or modulate) the radio-frequency signals to radio (or intermediate) frequencies. DAC circuit 62 and mixer 64 are sometimes be considered part of transmitter circuitry 30. The upconverted radio-frequency signals can then be fed to amplifier circuitry 50. The PA circuitry 52 can include one or more amplifiers coupled in series and/or in parallel that are configured to amplify signals for transmission by antenna 42.

The circuitry described above for preparing signals for transmission by antenna 42 is sometimes referred to collectively as wireless transmitting circuitry. If desired, one or more additional front end module components such as radio-frequency filter circuitry 44 of FIG. 2 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), impedance matching circuitry, antenna tuning circuitry (e.g., networks of capacitors, resistors, inductors, and/or switches that adjust the frequency response of antenna 42), radio-frequency coupler circuitry, charge pump circuitry, power management circuitry, and/or any other desired front-end module circuitry can optionally be coupled at the input and/or output of amplifier circuitry 50 along the radio-frequency transmission line path.

Power detection circuits can be coupled to the outputs of the radio-frequency amplifiers to enable power monitoring operations. Still referring to FIG. 3, a first power detection circuit such as power detector 70-TX may be coupled to the output of transmitting amplifier circuitry 50, whereas a second power detection circuit such as power detector 70-RX may be coupled to the output of receiving amplifier circuitry 52. Power detector 70-TX can be used to detect or measure an output power level of radio-frequency signals generated at the output of amplifier circuitry 50. The detected output power level can then be used by an automatic power control (APC) algorithm to dynamically adjust the gain of power amplifier circuitry 50 to ensure that the transmit path is outputting signals at desired power levels. The APC algorithm, which can run on processor 26 or other control circuitry in device 10, can compare the measured output power level to a reference power level. If the output power level is too high, the APC algorithm can reduce the gain of amplifier 50. If the output power level is too low, the APC algorithm can increase the gain of amplifier 50.

Power detector 70-RX can be used to detect or measure an output power level of radio-frequency signals generated at the output of receiving amplifier circuitry 52. The detected output power level can then be used by an automatic gain control (AGC) algorithm to dynamically adjust the gain of LNA circuitry 52 to ensure that the receive path is outputting signals at desired power levels regardless of the strength of signals arriving at the input of circuitry 52. The AGC algorithm, which can run on processor 26 or other control circuitry in device 10, can be used to ensure that signals are output from circuitry 52 at a constant output power level. If the input signal is weak, the AGC algorithm can increase the gain of amplifier 52 to maintain constant output level. If the input signal is strong, then the AGC algorithm can reduce the gain of amplifier 52 to prevent the output level from becoming too high.

The configuration of FIG. 3 in which transmit path and the receive path share a common antenna 42 via duplexer 60 is illustrative. The present embodiments are not limited to a time-division duplexing system where the transmit and receive paths share the same antenna. In other embodiments, a transmit path including power amplifier 50 can be coupled to a first antenna, whereas a receive path including low noise amplifier 52 can be coupled to a second antenna separate from the first antenna. In such scenarios, power detector 70-TX can be coupled to the output of power amplifier 50 while power detector 70-RX can be coupled to the output of low noise amplifier 52.

Figure 4:
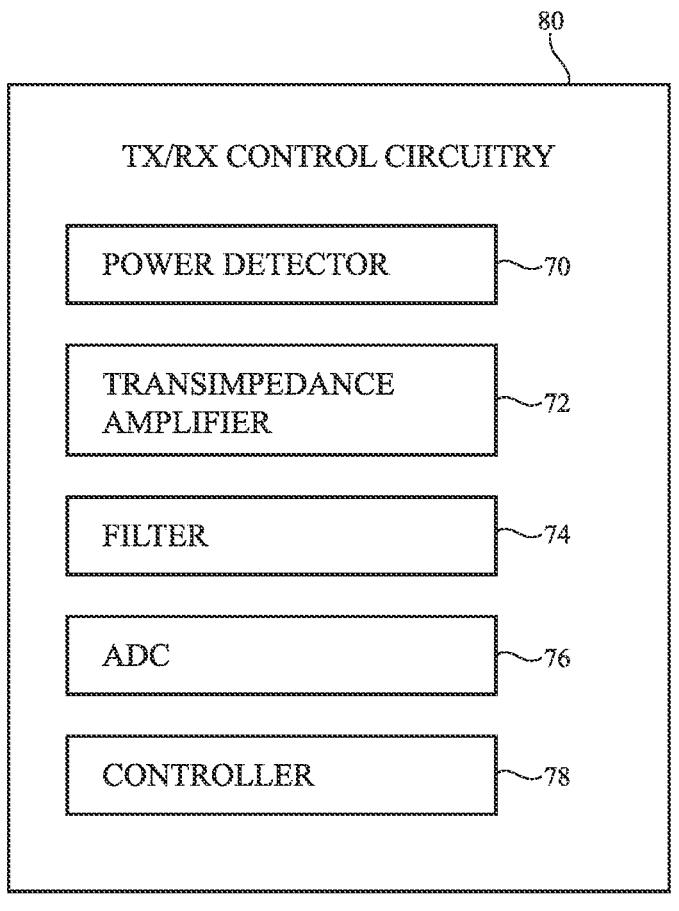
FIG. 4 is a diagram of illustrative control circuitry for a radio-frequency amplifier in accordance with some embodiments.

A power detector 70 is sometimes considered part of transmit (TX) or receive (RX) control circuitry 80 (see, e.g., FIG. 4). Transmit control circuitry 80 can include a transmit power detector 70 (see, e.g., power detector 70-TX coupled to the output of power amplifier 50 in FIG. 3), whereas receive control circuitry 80 can include a receive power detector 70 (see, e.g., power detector 70-RX coupled to the output of LNA 52 in FIG. 3). As shown in FIG. 4, TX/RX control circuitry 80 can further include an amplifier such as transimpedance amplifier 72, a filtering circuit such as filter 74, a data converter such as analog-to-digital converter (ADC) 76, and a controller 78.

Power detector 70 can have an output that is coupled to transimpedance amplifier 72 (e.g., transimpedance amplifier 72 can have an input configured to receive signals from power detector 70). Transimpedance amplifier 72 can refer to and be defined herein as a circuit that is configured to convert an input current signal to a corresponding output voltage signal. Transimpedance amplifier 72 may have an output that is coupled to filter 74 (e.g., filter 74 can have an input configured to receive signals from amplifier 72). Filter 74 can be an antialiasing filter. Filter 74 may have an output that is coupled to ADC circuit 76 (e.g., ADC 76 can have an input configured to receive signals from filter 74). ADC circuit 76 can output corresponding digital signals to controller 78. Controller 78 within TX control circuitry 80 may be used to run or execute an APC algorithm for controlling power amplifier circuitry 50, whereas controller 78 within RX control circuitry 80 may be used to run or execute or an AGC algorithm for controlling receive LNA circuitry 52. In general, controller 78 may be formed as part of processor 26 (see FIGS. 2 and 3), processing circuitry 18 (see FIG. 1), or other processing subsystem on device 10.

Figure 5:
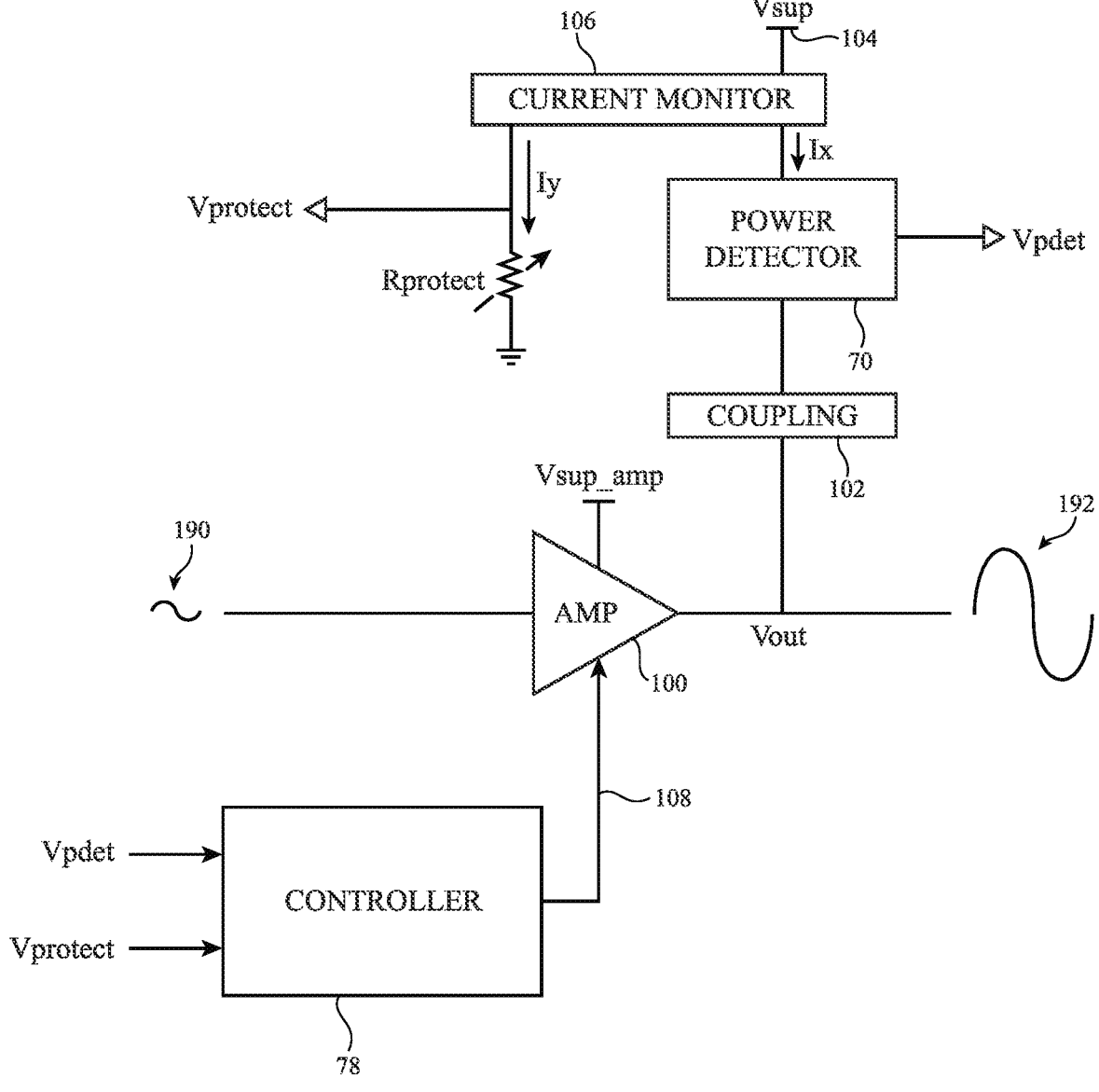
FIG. 5 is a diagram of an illustrative radio-frequency power detector with associated protection circuitry in accordance with some embodiments.

FIG. 5 is a diagram of an illustrative radio-frequency power detection circuit 70 coupled to an output of radio-frequency amplifier 100. Radio-frequency amplifier 100 may represent a power amplifier in the transmit path (see, e.g., amplifier 50 in FIG. 3) or may represent a low noise amplifier in the receive path (see, e.g., amplifier 52 in FIG. 3). Radio-frequency (RF) amplifier 100 may receive a radio-frequency input signal (see waveform 190) and may output a corresponding amplified radio-frequency output signal (see waveform 192). The amplified radio-frequency signal 192 generated at the output of amplifier 100 may have an output voltage Vout. The output of radio-frequency amplifier 100 may be coupled to power detection circuit 70 via coupling component such as coupling component 102. Coupling component 102 can, for example, be an AC (alternating current) coupling capacitor 102. Power detection circuit 70 may monitor amplifier output voltage Vout and generate a corresponding power detection voltage Vpdet based on a signal amplitude, power level, or signal strength of the amplifier output signal. Power detection voltage Vpdet may be a direct current (DC) voltage signal.

Figure 7:
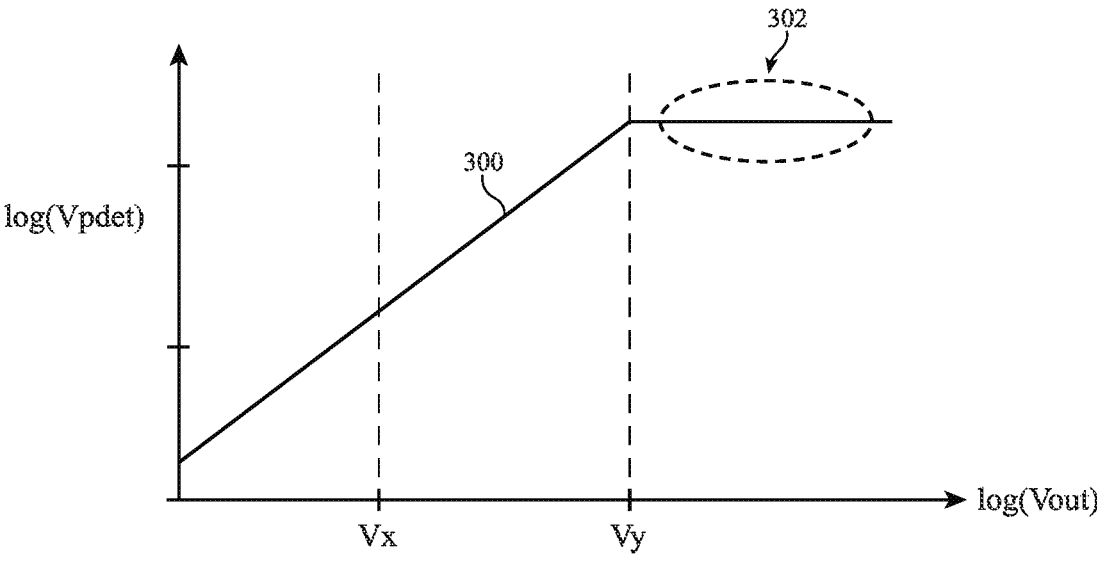
FIG. 7 is a plot showing an illustrative gain/power control range of a power detector in accordance with some embodiments.

FIG. 7 is a plot showing an illustrative gain/power control range of power detection circuit 70. For example, FIG. 7 plots the power detection output voltage Vpdet (in the logarithmic scale) as a function of the AC signal amplitude of amplifier output voltage Vout (also in the logarithmic scale). At lower signal levels (e.g., when the log of Vout is around Vx), power detection voltage Vpdet can vary, as shown by the sloped line portion 300. The slope of line portion 300 can be used by an automatic gain control algorithm or an automatic power control algorithm to dynamically adjust the gain of radio-frequency amplifier 100 to ensure optimal efficiency. When the signal level exceeds a threshold level (e.g., when the log of Vout is at or exceeds threshold Vy), the power detection voltage Vpdet may clip or saturate such that Vpdet plateaus as shown by the flat line portion 302. Thus, for larger amplifier input signals, the power detection circuit 70 may be saturated and is unable to provide further information to help control amplifier 100.

If care is not taken, feeding large radio-frequency signals through amplifier 100 can potentially damage amplifier 100 and cause reliability issues that would degrade the overall life time of amplifier 100 and any associated circuitry. For example, in-band blocker signals, out-of-band blocker signals, and/or other undesired large, unexpected blocking signals can be inadvertently received by the antenna and, if fed through a corresponding low noise amplifier with a high gain setting, can result in the generation of very large signal amplitudes that can damage the surrounding circuit components. In accordance with some embodiments, radio-frequency amplifier 100 may be provided with additional circuitry configured to help protect amplifier 100 from being damaged when large signal amplitudes are detected.

Referring back to FIG. 5, power detector 70 may be coupled to a current monitoring circuit 106 that monitors a supply current Ix for powering the power detector 70. As shown in FIG. 5, power detector 70 may receive supply current Ix from power supply line 104 (e.g., a positive power supply terminal on which positive power supply voltage Vsup is provided). Supply current Ix is sometimes referred to herein as the power detector supply current. Current monitoring circuit 106 may monitor the power detector supply current Ix and output a corresponding current Iy that is proportional to supply current Ix. As an example, current Iy may be identical to supply current Ix and can be referred to as a replica current. As another example, current Iy may be a scaled version of supply current Ix and can be referred to as a mirrored current. For instance, if the current mirroring factor is equal to one, Iy will be equal to Ix. If the current mirroring factor is equal to two, the mirrored current Iy will be equal to 2*Ix. If the current mirroring factor is equal to three, the mirrored current Iy will be equal to 3*Ix. In general, the current mirroring factor can be equal to 4 or more, in the range of 5-10, in the range of 10-20, or more than 20.

The mirrored current Iy can be passed through a current-to-voltage converter such as a resistor Rprotect to generate a protection voltage Vprotect. Resistor Rprotect can be an adjustable resistance (e.g., resistor Rprotect can have an adjustable resistance value). Resistor Rprotect can be adjusted to accommodate different protection levels or ranges and can be calibrated to determine the appropriate setting. Current monitoring circuit 106 for generating a mirrored supply current Iy and resistor Rprotect for generating a protection voltage Vprotect that can be used to prevent damage at radio-frequency amplifier 100 are sometimes referred to collectively as amplifier protection circuitry or overvoltage protection (OVP) circuitry. Protection voltage Vprotect may be a DC voltage.

Figure 8:
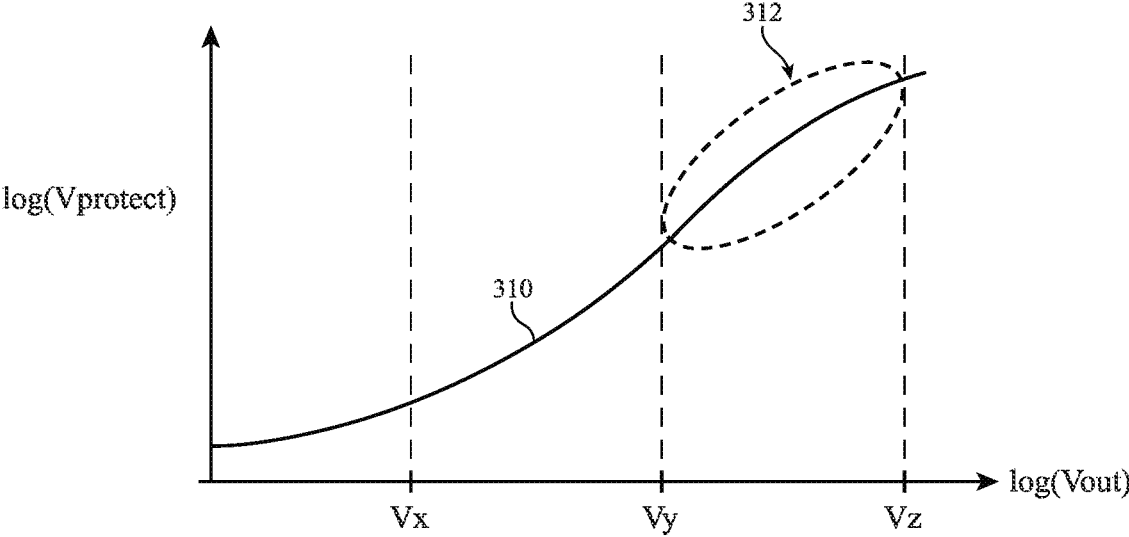
FIG. 8 is a plot showing an illustrative protection control range of amplifier protection circuitry in accordance with some embodiments.

FIG. 8 is a plot showing an illustrative protection control range of the amplifier protection circuitry. For example, FIG. 8 plots the protection voltage Vprotect (in the logarithmic scale) as a function of the AC signal amplitude of amplifier output voltage Vout (also in the log scale). At lower signal levels (e.g., when the log of Vout is around Vx), protection voltage Vprotect can vary, as shown by the sloping line portion 310. When the signal level exceeds threshold level Vy, protection voltage Vprotect may continue to vary as shown by the sloping line portion 312. Thus, while the power detection voltage Vpdet saturates (clips) for signal levels above Vy, the protection voltage Vprotect does not saturate for signal levels above Vy and can continue to increase and provide additional information that can be used to help protect the radio-frequency amplifier from damage. In other words, the amplifier protection circuitry can provide a signal monitoring range that is greater than the power detection circuit 70 (e.g., Vpdet clips or saturates earlier than Vprotect).

Protection voltage Vprotect and power detection voltage Vpdet can be fed to a control circuit such as controller 78. Controller 78 may be formed as part of processor 26 (see FIGS. 2 and 3), processing circuitry 18 (see FIG. 1), or other processing subsystem on device 10. Controller 78 may control radio-frequency amplifier 100 based on the values of Vpdet and Vprotect (see amplifier control path 108). Controller 78 can monitor whether Vout exceeds a predetermined threshold level (see, e.g., Vy in FIG. 7) to determine Vpdet has saturated. A Vout exceeding threshold Vy is indicative of Vpdet clipping. A Vout being less than threshold Vy is indicative of Vpdet that has not yet saturated. If Vpdet has not yet saturated, then Vpdet can be used by an automatic power control (APC) algorithm or an automatic gain control (AGC) algorithm running on controller 78 to dynamically adjust the gain of amplifier 100 to ensure that it is outputting radio-frequency signals at the desired power level(s).

If controller 78 determines that Vpdet has saturated, controller 78 can switch to or fall back on the extended range of Vprotect to perform one or more actions that would protect amplifier 100 from being damaged due to overly large signal swings. As an example, when Vout is within the range of Vy to Vz (see FIG. 8), controller 78 can adjust one or more bias voltages within amplifier 100 to reduce or attenuate the gain of amplifier 100 to proactively prevent amplifier 100 from outputting overly large signals. The tuning of the bias voltages by controller 78 can occur gradually or abruptly. As another example, when Vout is within the range of Vy to Vz, controller 78 can adjust a supply voltage Vsup_amp of amplifier 100 (e.g., controller 78 can lower Vsup_amp to reduce or attenuate the gain of amplifier 100 to proactively prevent amplifier 100 from outputting overly large signals). The tuning of the amplifier supply voltage Vsup_amp by controller 78 can occur gradually or abruptly. As another example, when Vout is within the range of Vy to Vz, controller 78 can selectively deactivate one or more amplifying stages within amplifier 100 to reduce or attenuate the gain of amplifier 100 to proactively prevent amplifier 100 from outputting overly large signals. As another example, when Vout exceeds another threshold level Vz, controller 78 can shut or power down amplifier 100 partially or entirely to proactively prevent permanent damage to the wireless circuitry. As other examples, controller 78 can optionally adjust one or more amplifier head (power supply) switches, can adjust other components within radio-frequency amplifier 100, can perform a combination of the above techniques, and/or can make other dynamic adjustments associated with amplifier circuitry 100.

Figure 6A:
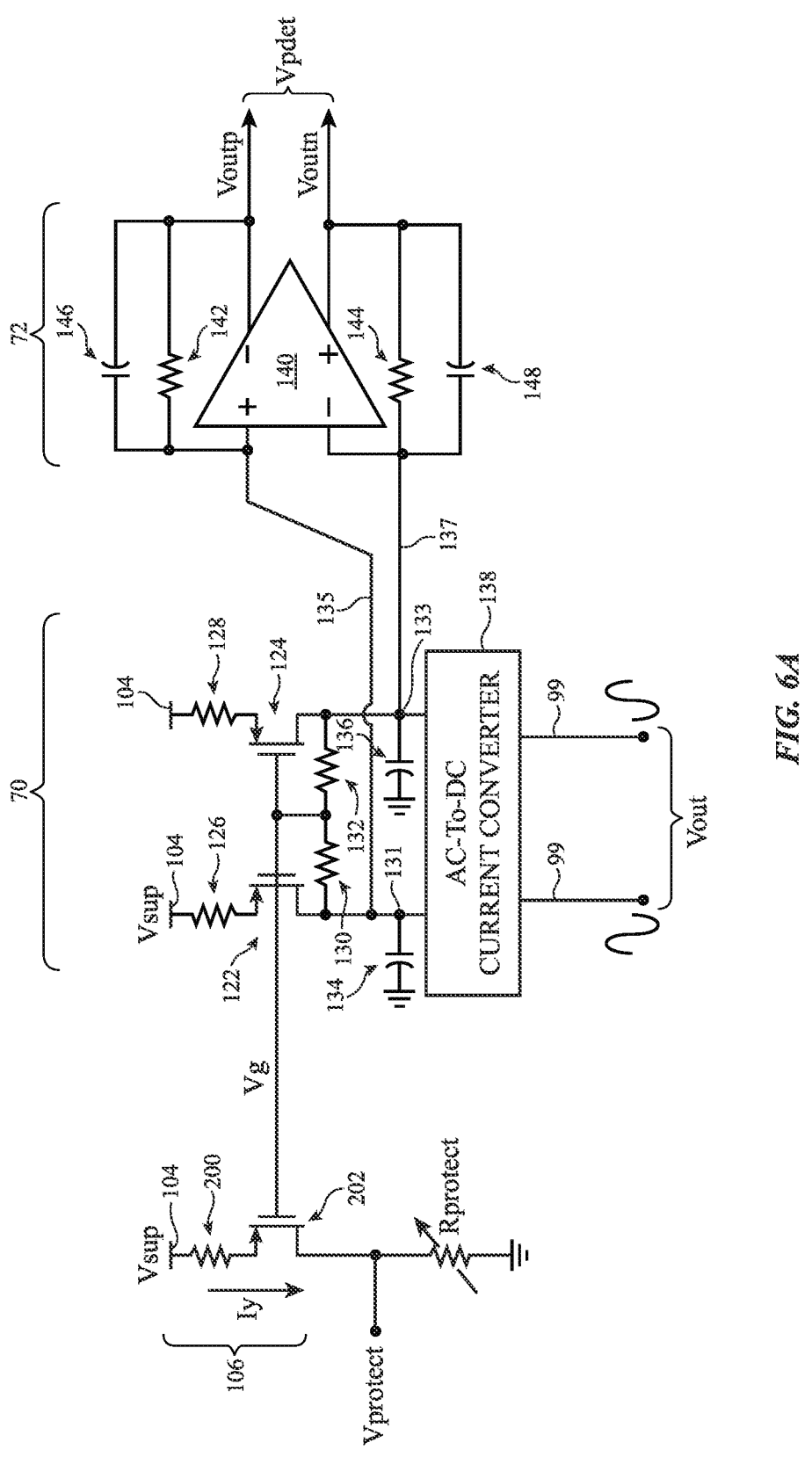
FIGS. 6A and 6B are circuit diagrams showing illustrative implementations of the radio-frequency power detector and protection circuitry of FIG. 5 in accordance with some embodiments.

FIG. 6A is a circuit diagram of an illustrative implementation of radio-frequency power detector 70 and the amplifier (over voltage) protection circuitry of the type described in connection with FIG. 5. As shown in FIG. 6A, power detector 70 may have an input paths 99 configured to receive amplifier output voltage Vout (e.g., an amplified radio-frequency signal) from an associated radio-frequency amplifier. Although two input paths 99 are shown to illustrate a differential signal path, a single input path can alternatively be implemented to convey Vout to converter 138. Power detector 70 may have an AC voltage to DC current conversion subcircuit 138, sometimes referred to as an AC-to-DC converter or a squaring subcircuit (e.g., a subcircuit configured to perform a squaring function $x^2$ for an input signal x received at input port 99). AC-to-DC current converter 138 may include one or more input transistors, one or more bias transistors, and/or one or more cascode transistors. Input port 99 may be a single-ended input or a differential input.

Power detector 70 may further include load transistors 122 and 124. Load transistors 122 and 124 may be p-type metal-oxide-semiconductor (PMOS) transistors, as an example. Load transistor 122 may have a drain terminal coupled to converter 138, a gate terminal that is coupled to its own drain terminal via resistor 130, and a source terminal coupled to positive power supply line 106 via source resistor 126. Similarly, load transistor 124 may have a drain terminal coupled to converter 138, a gate terminal that is coupled to its own drain terminal via resistor 132, and a source terminal coupled to power supply line 106 via source resistor 128. The terms "source" and "drain" are sometimes used interchangeably when referring to current-conducting terminals of a metal-oxide-semiconductor transistor. The source and drain terminals are therefore sometimes referred to as "source-drain" terminals (e.g., a transistor has a gate terminal, a first source-drain terminal, and a second source-drain terminal).

Power detection circuit 70 may have an output that is coupled to transimpedance amplifier 72. In the example of FIG. 6A, a first power detector output node 131 at the drain of load transistor 122 can be coupled to a first input of amplifier 72 via path 135, whereas a second power detector output node 133 at the drain of load resistor 124 can be coupled to a second input of amplifier 72 via path 137. A first shunt capacitor 134 may be coupled to output node 131. A second shunt capacitor 136 may be coupled to output node 133. Amplifier 72 can include a differential amplifier 140 having a first (+) input, a second (−) input, a first output on which output voltage Voutp is generated, a second output on which output voltage Voutn is generated, feedback resistor 142 and capacitor 146 coupled between the first input and the first output of amplifier 72, and feedback resistor 144 and capacitor 148 coupled between the second input and the second output of amplifier 72. The difference between Voutp and Voutn is equal to power detection voltage Vpdet.

Figure 6B:
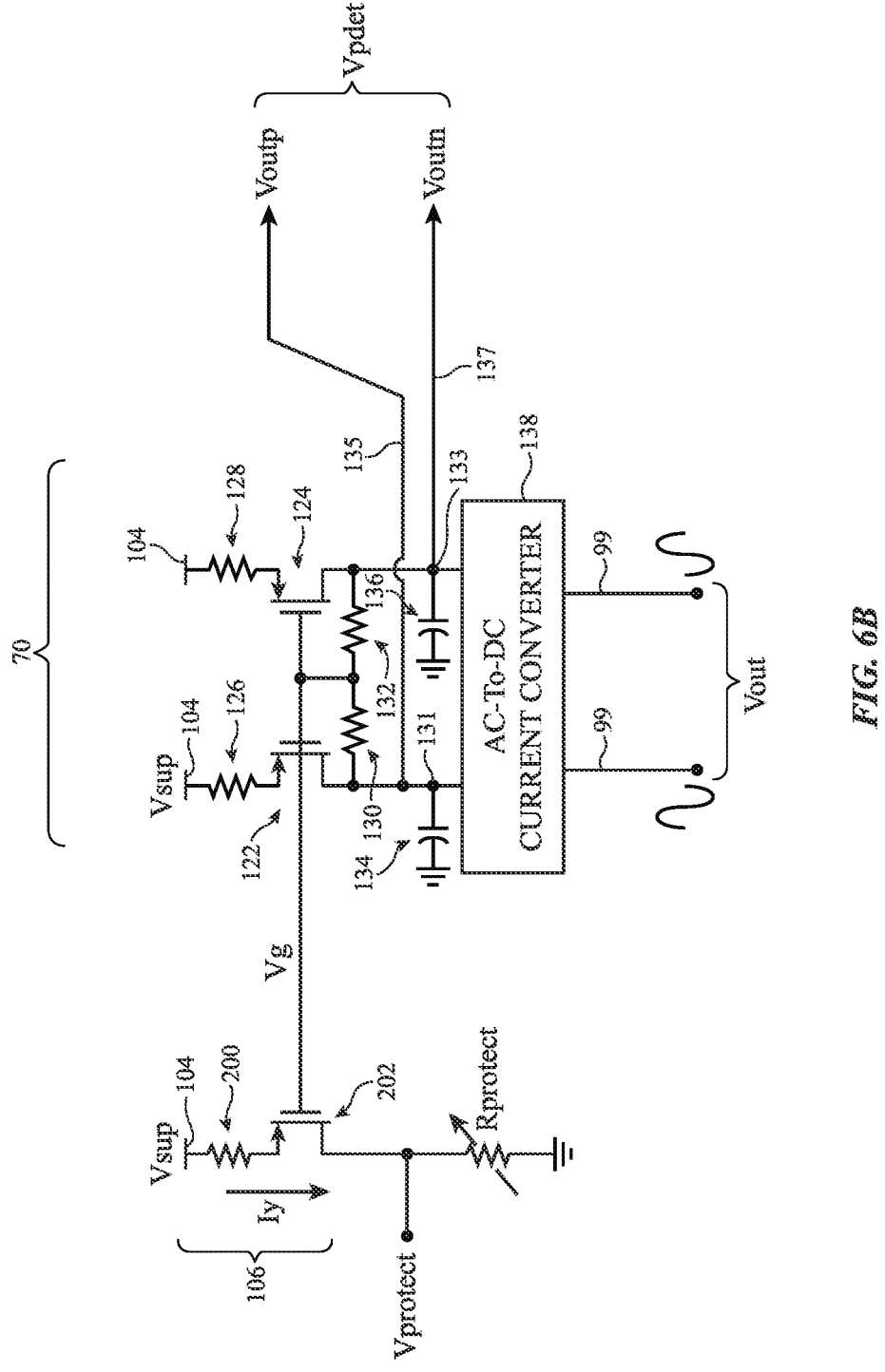

The circuit structure of transimpedance amplifier 72 as shown in FIG. 6A is exemplary. Other types of transimpedance amplifiers can be employed. The output of amplifier 72 can optionally be coupled to one or more filters, to one or more ADCs 76, and/or to one or more controller 78 as described in connection with FIG. 4. FIG. 6B shows another embodiment in which the output of power detector 70 is not coupled to a transimpedance amplifier 72. As shown in FIG. 6B, a first power detector output voltage Voutp can be generated at output node 131, whereas a second power detector output voltage Voutn can be generated at output node 133. The difference between Voutp and Voutn is equal to power detection voltage Vpdet.

Referring to either FIG. 6A or FIG. 6B, the amplifier protection circuitry can include a transistor 202, a resistor 200, and resistor Rprotect. Transistor 202 may be a PMOS transistor (as an example). Transistor 202 may have a first source-drain terminal (e.g., a source terminal) coupled to positive power supply line 104 via resistor 200, a second source-drain terminal coupled to ground via resistor Rprotect, and a gate terminal coupled (shorted) to the gate terminals of the load transistors 122 and 124 in power detector 70. Configured in this way, the gate voltage Vg presented at the gate terminals of the load transistors 122 and 124 is fed to the gate terminal of transistor 202, and a mirrored current Iy can flow through transistor 202. Components 200 and 202 can be collectively referred to as the current monitoring circuit 106. Transistor 202 can sometimes be referred to as a current mirroring circuit or a current mirror. Resistor 200 can be fixed or can be adjustable. The sizing of transistor 202 can be selected to produce the desired current mirroring ratio. For example, if the size of transistor 202 is two times the size of the load transistors, then the mirrored current Iy will be two times the supply current of power detector 70. As another example, if the size of transistor 202 is five times the size of the load transistors, then the mirrored current Iy will be five times the supply current of power detector 70. In general, the current mirroring factor can be equal to 1, 2, 3, 4, in the range of 5-10, in the range of 10-20, or more than 20.

Mirrored current Iy can be passed through resistor Rprotect to generate protection voltage Vprotect. The value of resistance Rprotect can be selected or adjusted so that protection voltage Vprotect can provide a wider protection range that extends beyond the power control range of power detection voltage Vpdet. The value of resistance Rprotect can optionally be calibrated at the factory or in a laboratory. An overvoltage protection voltage Vprotect generated in this way can be fed back to controller 78, along with power detection voltage Vpdet, to dynamically adjust the radio-frequency amplifier as the amplifier output voltage varies.

The methods and operations described above in connection with FIGS. 1-8 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

What is claimed is:

1. Wireless circuitry comprising:
a radio-frequency amplifier;
a power detection circuit coupled to an output of the radio-frequency amplifier and configured to output a power detection voltage;
a current mirror circuit configured to output a current that is proportional to a supply current of the power detection circuit;

a current-to-voltage converter configured to receive the current from the current mirror circuit and to provide a corresponding protection voltage; and
a control circuit configured to adjust the radio-frequency amplifier based on the protection voltage and the power detection voltage.

2. The wireless circuitry of claim 1, wherein the current-to-voltage converter comprises a resistor causing a voltage drop corresponding to the protection voltage, and wherein the current mirror circuit comprises a transistor having a gate terminal coupled to the power detection circuit, a first source-drain terminal coupled to a power supply line, and a second source-drain terminal coupled to the resistor.

3. The wireless circuitry of claim 2, wherein the resistor comprises an adjustable resistor having a first terminal coupled to the second source-drain terminal of the transistor and having a second terminal coupled to a ground line.

4. The wireless circuitry of claim 2, further comprising an additional resistor coupled between the power supply line and the first source-drain terminal of the transistor.

5. The wireless circuitry of claim 1, wherein the power detection circuit comprises:
an alternating current (AC) to direct current (DC) conversion subcircuit;
a first load transistor coupled between a positive power supply line and the AC to DC conversion subcircuit; and
a second load transistor coupled between the positive power supply line and the AC to DC conversion subcircuit, wherein the current mirror circuit is coupled to gate terminals of the first and second load transistors.

6. The wireless circuitry of claim 5, wherein the power detection circuit further comprises:
a first additional resistor coupled between the positive power supply line and the first load transistor;
a second additional resistor coupled between the positive power supply line and the second load transistor;
a third additional resistor coupled between the gate terminal and a source-drain terminal of the first load transistor; and
a fourth additional resistor coupled between the gate terminal and a source-drain terminal of the second load transistor.

7. The wireless circuitry of claim 5, further comprising a coupling component having a first terminal coupled to the output of the radio-frequency amplifier and having a second terminal coupled to the AC to DC conversion subcircuit.

8. The wireless circuitry of claim 1, wherein the power detection voltage output from the power detection circuit saturates when a signal level at the output of the radio-frequency amplifier exceeds a threshold level, and wherein the protection voltage does not saturate when a signal level at the output of the radio-frequency amplifier exceeds the threshold level.

9. The wireless circuitry of claim 1, wherein the power detection voltage varies within a first range of signal levels at the output of the radio-frequency amplifier and wherein the protection voltage varies within a second range of signal levels, greater than the first range of signal levels, at the output of the radio-frequency amplifier.

10. The wireless circuitry of claim 1, wherein the control circuit is configured to adjust the radio-frequency amplifier by adjusting a supply or bias voltage of the radio-frequency amplifier to reduce a gain of the radio-frequency amplifier.

11. A method of operating wireless circuitry, comprising:
with a radio-frequency amplifier, amplifying radio-frequency signals;

with a power detector coupled to an output of the radio-frequency amplifier, generating a power detection signal;

with a current mirror circuit, outputting a current that is proportional to a supply current of the power detector;

with a current-to-voltage converter, receiving the current and providing a corresponding protection signal; and with a controller, adjusting the radio-frequency amplifier based on the power detection signal and the protection signal.

12. The method of claim 11, wherein the current-to-voltage converter comprises a resistor causing a voltage drop corresponding to the protection signal.

13. The method of claim 12, further comprising:

when signal levels at the output of the radio-frequency amplifier are within a first range, using the power detection signal to adjust a gain of the radio-frequency amplifier in accordance with an automatic power control algorithm or an automatic gain control algorithm; and when signal levels at the output of the radio-frequency amplifier are within a second range different than the first range, using the protection signal to reduce the gain of the radio-frequency amplifier.

14. The method of claim 13, wherein the power detection signal clips when signal levels at the output of the radio-frequency amplifier are within the second range, and wherein the protection signal does not clip when signal levels at the output of the radio-frequency amplifier are within the second range.

15. Circuitry comprising:

an amplifier;

a power detection circuit coupled to an output of the amplifier and configured to output a power detection signal;

overvoltage protection circuitry coupled to the power detection circuit and configured to output a protection signal; and a control circuit having a first input configured to receive the power detection signal, a second input configured to receive the protection signal, and an output coupled to the amplifier.

16. The circuitry of claim 15, wherein the amplifier comprises a radio-frequency amplifier configured to amplify radio-frequency signals.

17. The circuitry of claim 15, wherein the power detection circuit comprises:

a signal squaring subcircuit;

a first load transistor coupled to the signal squaring subcircuit; and a second load transistor coupled to the signal squaring subcircuit, wherein the first and second load transistors have gate terminals coupled to the overvoltage protection circuitry.

18. The circuitry of claim 15, wherein the overvoltage protection circuitry comprises:

a transistor having a gate terminal coupled to the power detection circuit and configured to output a current that is proportional to a supply current of the power detection circuit; and a current-to-voltage converter coupled in series with the transistor and configured to generate the protection signal.

*    *    *    *    *